United States Patent
Maiz et al.

(10) Patent No.: US 6,943,648 B2
(45) Date of Patent: Sep. 13, 2005

(54) METHODS FOR FORMING A FREQUENCY BULK ACOUSTIC RESONATOR WITH UNIFORM FREQUENCY UTILIZING MULTIPLE TRIMMING LAYERS AND STRUCTURES FORMED THEREBY

(75) Inventors: Jose Maiz, Portland, OR (US); Li-Peng Wang, Santa Clara, CA (US); Qing Ma, San Jose, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 10/428,692

(22) Filed: May 1, 2003

(65) Prior Publication Data

US 2004/0217829 A1 Nov. 4, 2004

(51) Int. Cl.[7] .............................. H03H 3/04; H03H 9/17; H03H 9/54
(52) U.S. Cl. ......................... 333/188; 333/187; 310/312
(58) Field of Search ................................. 333/186–192; 310/312, 364

(56) References Cited

U.S. PATENT DOCUMENTS 6,291,931 B1 * 9/2001 Lakin .......................... 310/364
6,339,276 B1 * 1/2002 Barber et al. ................ 310/312
2002/0189062 A1 * 12/2002 Lin et al. .................... 29/25.35

FOREIGN PATENT DOCUMENTS

JP          11-346137        * 12/1999

OTHER PUBLICATIONS

G.D. Mansfeld, et al., "Acoustic HBAR Spectroscopy of Metal (W, Ti, Mo, Al) Thin Films", 2001 IEEE Ultrasonics Symposium, Oct. 2001, pp. 415–418.

* cited by examiner

*Primary Examiner*—Barbara Summons
(74) *Attorney, Agent, or Firm*—Kathy J. Ortiz

(57) ABSTRACT

A method of forming a tuned resonator structure by first forming a base resonator structure that comprises a trimming layer on a resonator structure, wherein the trimming layer comprises at least one first low loss acoustic layer on the resonator structure, and at least one second low loss acoustic layer on the first low loss acoustic layer. Then, a "tuned" resonator structure is formed by measuring the frequency of the base resonator structure and removing the number of each of the two different low loss acoustic layers determined to be necessary to achieve the targeted frequency of the base resonator structure, thus improving the frequency control, reliability and performance of the resonating structure.

22 Claims, 5 Drawing Sheets

US 6,943,648 B2

METHODS FOR FORMING A FREQUENCY BULK ACOUSTIC RESONATOR WITH UNIFORM FREQUENCY UTILIZING MULTIPLE TRIMMING LAYERS AND STRUCTURES FORMED THEREBY

FIELD OF THE INVENTION

The present invention relates to the field of microelectronic device processing, and more particularly to a method of forming a microelectromechanical system (MEMS) such as a frequency bulk acoustic resonator (FBAR) with uniform frequency utilizing multiple trimming layers and structures formed thereby.

BACKGROUND OF THE INVENTION

Communication systems generally require partitioning of the electromagnetic frequency spectrum. Communication transceiver devices therefore must be capable of high frequency selectivity, i.e., capable of selecting a given frequency band while rejecting all others. Frequency-selective devices, such as filters, oscillators and mixers are therefore some of the most important components within a transceiver and the quality of the devices generally dictate the overall architecture of a given transceiver.

In wireless radio frequency (RF) devices, resonators are generally used for signal filtering and generation purposes. The current state of the art typically is the use of discrete crystals to make the resonators. To miniaturize devices, MEMS resonators have been contemplated. One type of MEMS resonator is a film bulk acoustic resonator (FBAR). A FBAR device has many advantages over prior art resonators such as low insertion loss at high frequencies, and lower thermal mass due to their compact size.

The resonance frequency of a FBAR device is determined by its thickness, which must be precisely controlled in order to have the desired filter response, such as exact central frequency and pass bandwidth. In a typical (FBAR) device, the resonance frequency after processing is usually different from the targeted value due to processing variation. For discrete crystal resonators as mentioned above, such resonance frequency error may be corrected using laser trimming technology, for example, in which a laser is directed towards the resonator and either removes or adds material to the resonator, thereby "tuning" the resonating frequency of the resonator to the desired targeted frequency. However, because MEMS resonators (particularly high frequency MEMS resonators) are generally much smaller in size than their crystal counterparts, traditional laser trimming technology is not a viable alternative. Accordingly, what is needed are techniques to modify the resonance frequency of a MEMS resonator.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
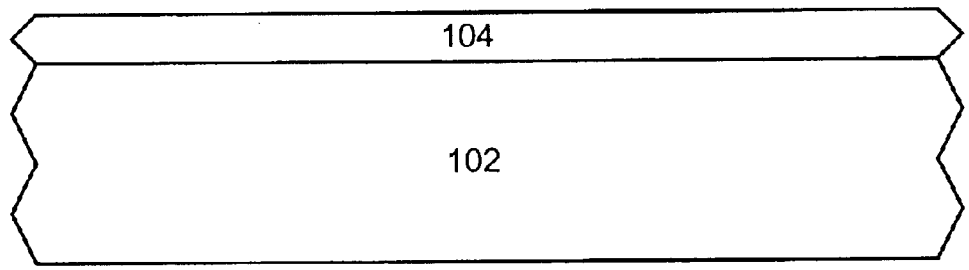
FIGS. 1a–1c represent cross-sections of structures that may be formed when carrying out an embodiment of the method of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a "tuned" resonator structure (i.e. the resonator structure frequency can be modified to achieve a desired targeted frequency) and its associated structures are described. Those methods comprise forming a base resonator structure by forming a trimming layer on a resonator structure, wherein the trimming layer comprises at least one first low loss acoustic layer on the resonator structure, and at least one second low loss acoustic layer on the first low loss acoustic layer. Then, a "tuned" resonator structure is formed by measuring the resonating frequency of the base resonator structure and removing the number of each of the two different low loss acoustic layers determined to be necessary to achieve the targeted frequency of the base resonator structure, thus improving the frequency control, reliability and performance of a resonator structure.

Figure 1B:
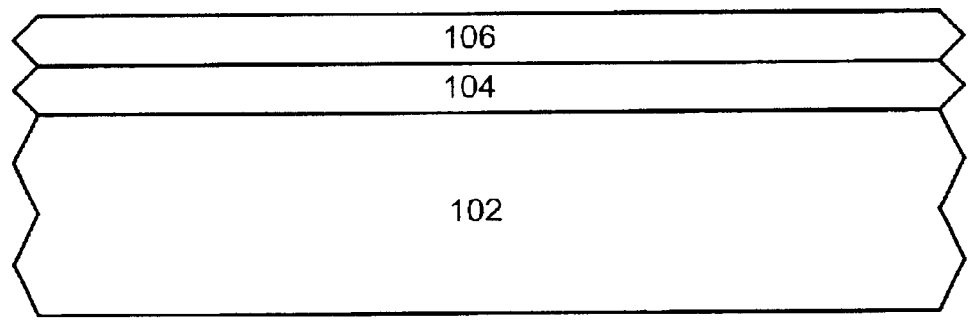
Figure 1C:
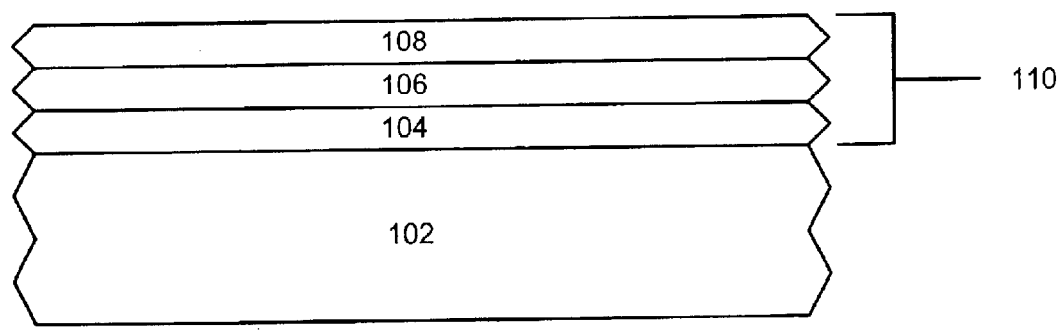

In an embodiment of the method of the present invention, as illustrated by FIGS. 1a–1c, a bottom electrode 104 is formed on a substrate 102 (FIG. 1a). The substrate 102 may comprise materials such as silicon, silicon-on insulator, germanium, indium antimonide, lead telluride, indium arsenide, indium phosphide, gallium arsenide, or gallium antimonide. Although several examples of materials from which the substrate 102 may be formed are described here, any material that may serve as a foundation upon which a microelectronic device, such as a MEMS resonator, may be built falls within the spirit and scope of the present invention.

The bottom electrode 104 may be formed on the substrate 102 using a conventional deposition method, e.g., a chemical vapor deposition ("CVD"), a low pressure CVD ("LPCVD"), a physical vapor deposition ("PVD"), or an atomic layer deposition ("ALD"). The bottom electrode 104 can be formed by using a variety of different materials, including but not limited to aluminum, tungsten, gold, titanium or molybdenum. Alternatively, other metals can be used to form the bottom electrode 104. In most applications, the bottom electrode 104 can be from about 1,500 angstroms to about 7,000 angstroms in thickness.

The piezoelectric layer 106 may then be formed using conventional deposition methods, on the bottom electrode 104 (FIG. 1b). Those skilled in the art will appreciate that the piezoelectric layer 106 may be formed from a variety of piezoelectric materials and may constitute multiple layers of such piezoelectric material. In a currently preferred embodiment, the piezoelectric layer 106 can include aluminum nitride (AlN) or zinc oxide (ZnO). Although a few examples of materials that may be used to form the piezoelectric layer 106 are described here, that layer may be made from other piezoelectric materials that serve to provide a piezoelectric layer 106 where the resonating frequency of the resonator structure 110 (FIG. 1c) is dependent on the thickness of the piezoelectric layer 106. The piezoelectric layer 106 thickness can range from about 10,000 angstroms to about 30,000 angstroms, but is thinner than required for a targeted resonating frequency of the resonator structure 110.

A top electrode 108 is then formed on the piezoelectric layer 106 (FIG. 1c), using similar methods and materials as described above with respect to the bottom electrode 104. The resulting resonator structure 110 (i. e. bottom electrode 104, piezoelectric layer 106 and top electrode 08) as depicted in FIG. 1c may include such resonator structures as film bulk acoustic resonators (FBAR's), thin film resonators (TFR's) or other such acoustic resonators as are known to those skilled in the art.

Figure 2A:
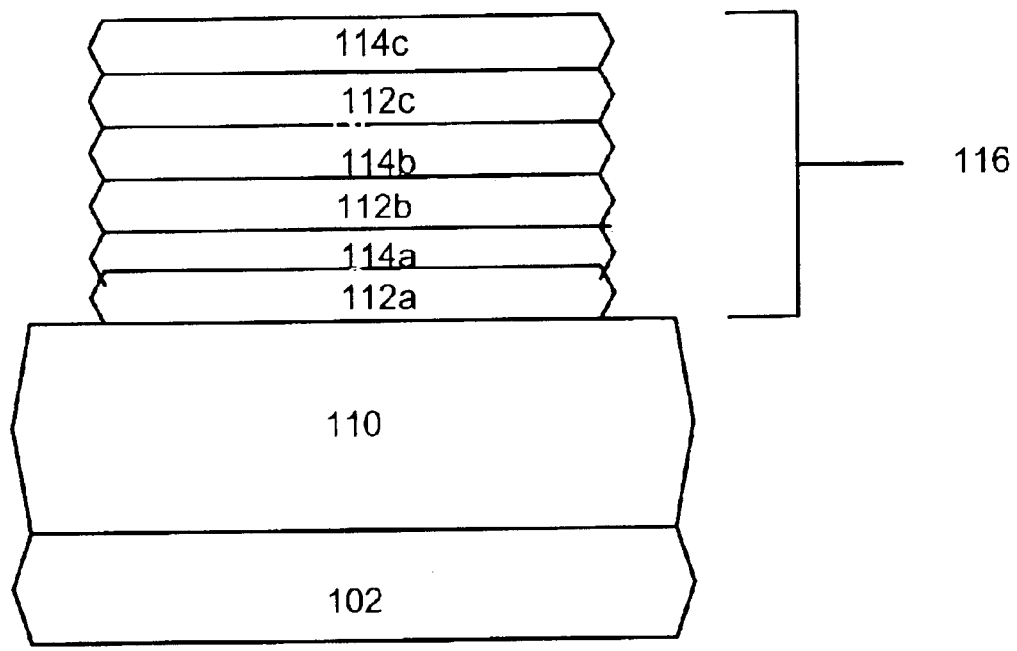
FIGS. 2a–2b represent cross-sections of structures that may be formed when carrying out an embodiment of the method of the present invention.
Figure 2B:
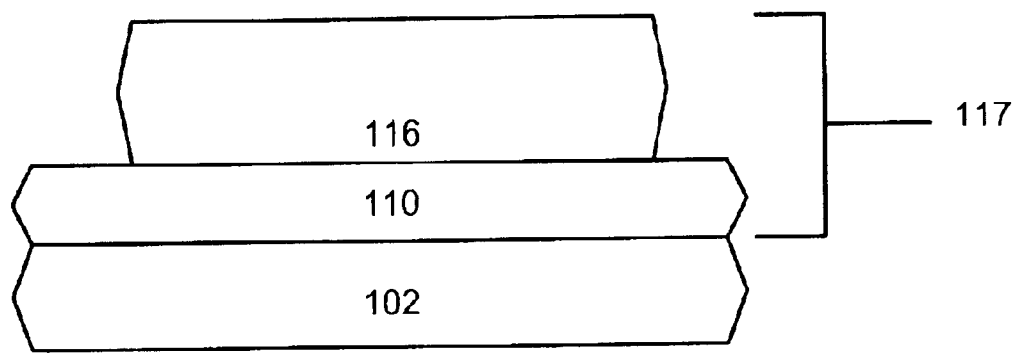

The trimming layer 116 is then formed on the resonator structure 110 to form a base resonator structure 117 (i.e. trimming layer 116 and resonator structure 110, as depicted in FIG. 2b). Again, as previously discussed, the trimming layer 116 comprises alternating layers of at least one first low loss acoustic layer (FIG. 2a) 112a–c and at least one second low loss acoustic layer (FIG. 2a) 114a–c. The first low loss acoustic layer 112a–c and the second low loss acoustic layer 114a–c comprise low loss acoustic materials, such as aluminum nitride (AlN), molybdenum (Mo), tungsten (W), polysilicon, microcrystal silicon oxide etc. The first low loss acoustic layer 112a–c comprises a different low loss acoustic material than the second low loss acoustic layer 114a–c, i.e. if the first low loss acoustic layer 112a–c material is chosen to be molybdenum, then the second low loss acoustic layer 114a–c material is not chosen to be molybdenum. Although a few examples of materials that may be used to form the first low loss acoustic layer 112a–c and the second low loss acoustic layer 114a–c are described here, those layers may be made from other low loss acoustic materials as are known to those skilled in the art. The first low loss acoustic layer 112a may be formed on the resonator structure 110 using deposition techniques known in the art. The second low loss acoustic layer 114a may then be formed on the first low loss acoustic layer 112a using deposition techniques known in the art. Each of the first low loss acoustic layer 112a–c and the second low loss acoustic layer 114a–c may typically be less than about 25 angstroms in thickness, but must be thinner than the tolerance thickness of the piezoelectric layer 106 for a targeted frequency of the resonator structure 110. For example, if the piezoelectric layer 106 has a thickness of about 1.8 microns to achieve a targeted resonating frequency for the resonating structure of about 2 GHz, and the tolerance thickness i.e. error thickness of the piezoelectric layer 106 is about 1.8 nm (about 1% error), then the thickness of the each of the first low loss acoustic layer 112a–c and the second low loss acoustic layer 114a–c must be less than the tolerance thickness of the piezoelectric layer 106 (less than about 1.8 nm in this example).

The first low loss acoustic layer 112a–c is highly selective in terms of etch rate in relation to the second low loss acoustic layer 114a–c, i.e. the first low loss acoustic layer 112a–c etches at a substantially different rate for the same set of etch parameters than the second low loss acoustic layer 114a–c, so that after the second low loss acoustic layer 114a–c is completely etched in a subsequent etching step (the details of such etching steps being known in the art and as such are not described herein), the first low loss acoustic layer 112a–c is not substantially etched, since the etch rate of the first low loss acoustic layer 112a–c is very slow for the given etch parameters in relation to the second low loss acoustic layer 114a–c. It is to be understood that the invention is not limited to a first low loss acoustic layer 112a–c and a second low loss acoustic layer 114a–c, but may include alternating additional low loss acoustic layers such as in the alternating of a first low loss acoustic layer 112a–c, a second low loss acoustic layer 114a–c, and a third low loss acoustic layer in order to form the trimming layer 116, for example. By forming the trimming layer 116 on the resonator structure 110, the resonator structure is made thicker than is necessary to achieve a desired target resonance frequency of a base resonator structure 117 (FIG. 2b).

Figure 3:
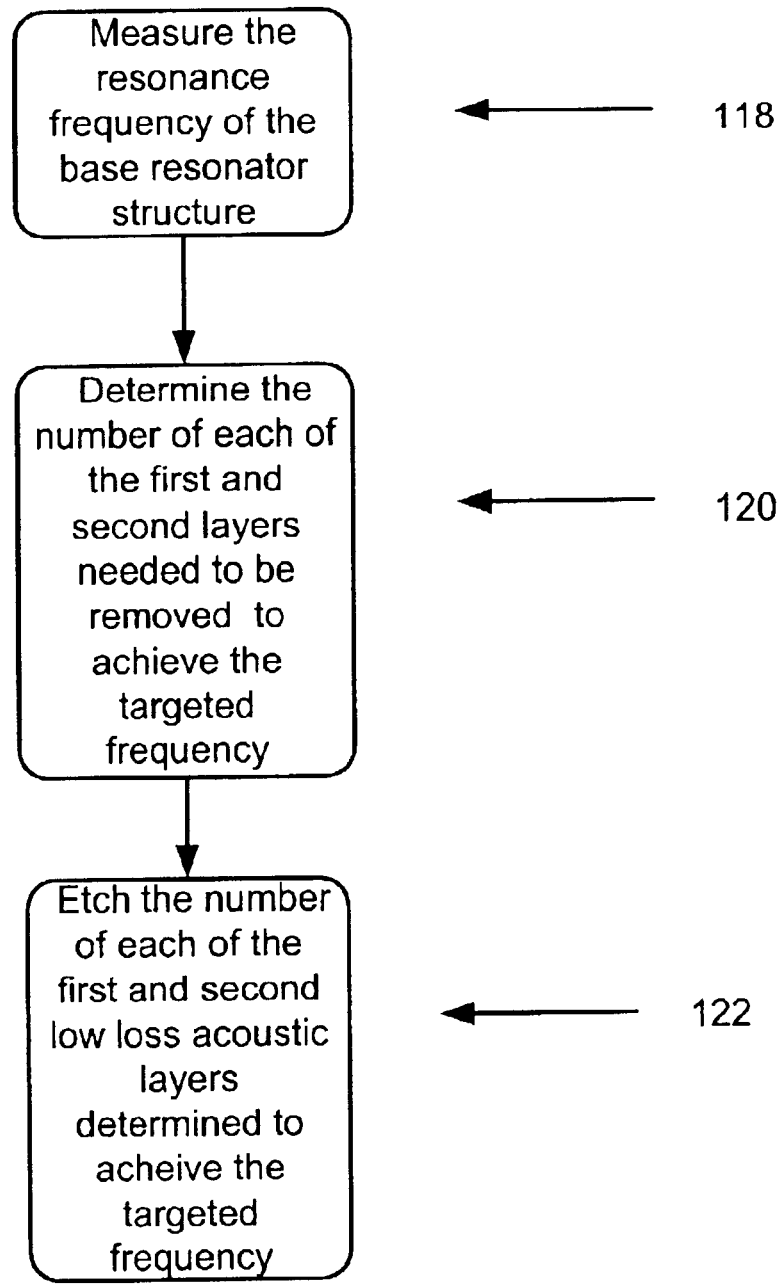
FIG. 3 is a process flow diagram according to an embodiment of the present invention.
Figure 4:
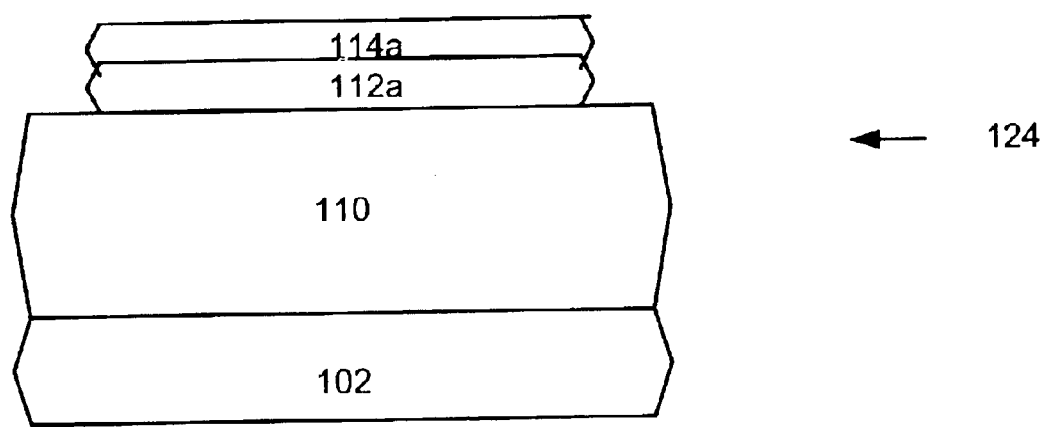
FIG. 4 represents a cross-section of a structure that may be formed when carrying out an embodiment of the method of the present invention.

After the base resonator structure 117 has been formed, the resonating frequency of the base resonator structure 117 may be determined by a variety of methods known in the art, including but not limited to using a microprobe to measure the resonance frequency 118 (FIG. 3) of the base resonator structure 117. If it is determined that the measured resonance frequency 118 is not within the desired tolerance for the targeted frequency of the base resonator structure 117, the number of each of the first low loss acoustic layer 112a–c and the second low loss acoustic layer 114a–c needed to be removed to achieve the targeted frequency can easily be determined 120 (FIG. 3) through calculation since the thickness of both the first low loss acoustic layer 112a–c and the second low loss acoustic layer 114a–c correspond to less than the frequency tolerance of the piezoelectric layer 106, and the additional thickness of the trimming layer 116 allows for the digital etching of each of the first low loss acoustic layer 112a–c and the second low loss acoustic layer 112a–c in order to achieve the required targeted resonance frequency of the base resonator structure 117. Since the first low loss acoustic layer 112a–c is highly selective in terms of etching with respect to the second low loss acoustic layer 114a–c, the resonating frequency of the base resonator structure 117 may be precisely controlled since the ability to remove either the first low loss acoustic layer 112a–c and/or the low loss acoustic second layer 114a–c enables the "tuning" of the base resonator structure 117. By etching away the determined number of individual layers of the first low loss acoustic layer 112a–c and/or the second low loss acoustic layer 114a–c necessary to achieve the targeted frequency 122 (FIG. 3), a tuned resonator structure 124 is formed (FIG. 4). Thus, by forming the tuned resonator structure 124, the resonating frequency of the base resonator structure 117 may be corrected for process variation either within an individual device or within a batch of devices, such as within an individual silicon wafer or between silicon wafers processed in a batch.

As described above, by forming a base resonator structure 117 comprising a trimming layer 116 and a resonator structure 110, wherein the resonating frequency of the base resonator structure 117 is modified by etching successive layers of a first low loss acoustic layer 112a–c and/or a second low loss acoustic layer 114a–c as is necessary to achieve the targeted resonance frequency of the base resonator structure 117, a tuned resonator structure 124 is formed that improves the frequency control, performance and reliability of a MEMS resonator. In addition, the method of the present invention greatly reduces process throughput time while improving process control, since by digitally etching (due to the high selectivity between the layers) layers of low loss acoustic material, the requirement of etch time control has been eliminated.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture a silicon device is well known in the art. Therefore, it is appreciated that the Figures provided herein illustrate only portions of an exemplary MEMS device that pertains to the practice of the present invention. Thus the present invention is not limited to the structures described herein.

What is claimed is:

1. A method of forming a trimming layer on a resonator structure, comprising:
   forming at least one first low loss acoustic layer on the resonator structure; and
   forming at least one second low loss acoustic layer on the first low loss acoustic layer, wherein the at least one first low loss acoustic layer and the at least one second low loss acoustic layer form a trimming layer, wherein the trimming layer is adapted to modify a resonating frequency of a base resonator structure.

2. The method of claim 1, wherein forming the trimming layer further comprises alternating a plurality of the first low loss acoustic layer and a plurality of the second low loss acoustic layer to form a trimming layer.

3. The method of claim 1, wherein modifying the resonating frequency of the base resonator structure comprises:
   measuring the resonating frequency of a base resonator structure;
   determining the number of each of the first low loss acoustic layers and second low loss acoustic layers needed to be removed from the trimming layer to achieve a targeted resonating frequency of the base resonator structure; and
   etching the number of each of the first low loss acoustic layers and the second low loss acoustic layers needed to be removed from the base resonator structure to achieve the targeted resonating frequency of the base resonator structure.

4. The method of claim 1, wherein the at least one first low loss acoustic layer etches at a substantially different rate than the at least one second low loss acoustic layer.

5. The method of claim 1 wherein the at least one first low loss acoustic layer and the at least one second low loss acoustic layer each comprise a different one of a low loss acoustic material including aluminum nitride, molybdenum, polysilicon, microcrystal silicon oxide, and tungsten.

6. The method of claim 1 wherein the resonator structure is an FBAR.

7. The method of claim 1 wherein the thickness of a piezoelectric layer within the resonator structure is thinner than required for a targeted frequency of the resonator structure.

8. The method of claim 7 wherein the thickness of the at least one first low loss acoustic layer is less than the tolerance thickness of the piezoelectric layer.

9. The method of claim 7 wherein the thickness of the at least one second low loss acoustic layer is less than the tolerance thickness of the piezoelectric layer.

10. A method of forming a tuned resonating structure, comprising:
    forming a base resonator structure further comprising:
        forming a bottom electrode on a substrate;
        forming a piezoelctric layer on the electrode;
        forming a top electrode on the piezoelectric layer to form a resonator structure;
        forming a trimming layer on the resonator structure further comprising:
            forming at least one first low loss acoustic layer on the resonator structure and at least one second low loss acoustic layer on the at least first low loss acoustic layer to form a base resonator structure; and
    forming a tuned resonator structure further comprising:
        measuring the frequency of the base resonator structure; and
        removing the number of each of the at least one first low loss acoustic layers and the at least one second low loss acoustic layers necessary to achieve the targeted frequency, wherein a tuned resonator structure is formed.

11. The method of claim 10, wherein forming the trimming layer further comprises alternating a plurality of the first low loss acoustic layer and a plurality of the second low loss acoustic layer to form a trimming layer.

12. The method of claim 10 wherein the thickness of the piezoelectric layer is thinner than required for a targeted frequency of the resonator structure.

13. The method of claim 10 wherein the thickness of the at least one first low loss acoustic layer is less than the tolerance thickness of the piezoelectric layer.

14. The method of claim 10 wherein the thickness of the at least one second low loss acoustic layer is less than the tolerance thickness of the piezoelectric layer.

15. The method of claim 10 and wherein by forming the trimming layer on the resonator structure, the resonator structure is made thicker than required for a targeted frequency.

16. The method of claim 10 wherein the resonator structure is an FBAR.

17. An apparatus comprising:
    a resonator structure; and
    a trimming layer on the resonator structure, wherein the trimming layer comprises alternating layers of a first low loss acoustic layer and a second low loss acoustic layer.

18. The apparatus of claim 17, wherein the first low loss acoustic layer etches at a substantially different rate than the second layer.

19. The apparatus of claim 17 wherein the first low loss acoustic layer and the second low loss acoustic layer each comprise a different one of a low loss acoustic material including aluminum nitride, polysilicon, microcrystal silicon oxide, molybdenum, and tungsten.

20. The apparatus of claim 17 wherein the thickness of the first low loss acoustic layer is less than the tolerance thickness of the piezoelectric layer.

21. The apparatus of claim 17 wherein the thickness of the second low loss acoustic layer is less than the tolerance thickness of the piezoelectric layer.

22. The apparatus of claim 17 wherein the resonator structure is an FBAR.

\* \* \* \* \*